(12) United States Patent
Sparks et al.

(10) Patent No.: US 7,741,218 B2
(45) Date of Patent: Jun. 22, 2010

(54) CONDUCTIVE VIA FORMATION UTILIZING ELECTROPLATING

(75) Inventors: Terry G. Sparks, Austin, TX (US); Robert E. Jones, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 291 days.

(21) Appl. No.: 11/679,512

(22) Filed: Feb. 27, 2007

(65) Prior Publication Data

US 2008/0206984 A1 Aug. 28, 2008

(51) Int. Cl.
*H01L 21/44* (2006.01)

(52) U.S. Cl. ............... 438/669; 438/612; 438/674; 438/675; 257/E21.575; 257/E21.585; 257/E21.586

(58) Field of Classification Search ............... 438/576
See application file for complete search history.

(56) References Cited

U.S. PATENT DOCUMENTS

| 6,221,769 | B1 | 4/2001 | Dhong et al. | |
|---|---|---|---|---|
| 7,109,068 | B2 | 9/2006 | Akram et al. | |
| 7,179,738 | B2 | 2/2007 | Abbott | |
| 2004/0173909 | A1* | 9/2004 | Sinha et al. | 257/762 |
| 2007/0045780 | A1* | 3/2007 | Akram et al. | 257/621 |
| 2008/0166874 | A1* | 7/2008 | Deligianni et al. | 438/675 |

FOREIGN PATENT DOCUMENTS

JP 08-279510 A 10/1996

OTHER PUBLICATIONS

Premachandran et al; "A Novel Electrically Conductive Wafer Through Hole Filled Vias Interconnect for 3D MEMS Packaging"; 2003 IEEE Electronic Components and Technology Conference; pp. 627-630.

Hauffe et al; "Optimized Micro-Via Technology for High Density and High Frequency (>40GHz) Hermetic Through-Wafer Connections in Silicon Substrates"; 2005 IEEE Electronic Components and Technology Conference; pp. 324-330.

Nguyen et al; "Through-Wafer Copper Electroplating for RF Silicon Technology"; ESSDERC, 2002, pp. 255-258.

Morrow et al; "Three-Dimensional Wafer Stacking via Cu-Cu Bonding Intergrated with 65-nm Strained-Si/Low-k CMOS Technology"; IEEE Electron Device Letters, vol. 27, No. 5, May 2006.

Wu et al; "A Through-Wafer Interconnect in Silicon for RFICs"; IEEE Transactions on Electron Devices, vol. 51, No. 11, Nov. 2004, pp. 1765-1771.

(Continued)

*Primary Examiner*—Charles D Garber
*Assistant Examiner*—Cheung Lee
(74) *Attorney, Agent, or Firm*—David G. Dolezal; Kim-Marie Vo

(57) ABSTRACT

A method for forming a conductive via is discussed and includes forming a seed layer over a first side of a semiconductor substrate, wherein the semiconductor substrate includes a first side opposite a second side, forming a via hole in a semiconductor substrate from the second side of the semiconductor substrate, wherein the via hole exposes the seed layer; and electroplating a conductive via material in the via hole from the seed layer. In one embodiment, a continuous conductive layer is formed over and electrically coupled to the seed layer. The continuous conductive layer can serve as the current source while electroplating the conductive via material.

22 Claims, 9 Drawing Sheets

OTHER PUBLICATIONS

Nguyen et al; "Through-Wafer Copper Electroplating for Three-Dimensional Interconnects"; J. of Micromechanics and Microengineering, 12 (2002), pp. 395-399.

International Search Report and Written Opinion for PCT Patent Application No. PCT/US2008/051987, dated May 27, 2008.

* cited by examiner

CONDUCTIVE VIA FORMATION UTILIZING ELECTROPLATING

BACKGROUND OF THE INVENTION

1. Field of the Invention

This invention relates in general to semiconductor processing and more specifically to conductive via formation utilizing electroplating.

2. Description of the Related Art

Semiconductor devices utilize through substrate electrical connections for transferring signals, power, and/or ground through a substrate. In one example, such connections may be utilized for transferring signals between integrated circuits in a multi integrated circuit package. In another example, a through substrate connection may be utilized as a ground connection for grounding a circuit to a package substrate. Such through substrate connections may be desirable because they are typically shorter and have less resistance and inductance than a wire bond connection.

Some through substrate connections are made by forming a conductive via through a substrate from the backside of a wafer to a contact pad of an interconnect layer. In one method of forming a conductive via through a substrate, a conformal seed layer is formed from the backside of the wafer. This seed layer is then used as a cathode for electroplating from the backside of the wafer. One problem with this method is that forming the seed layer in a through substrate via with a high aspect ratio can be difficult due to the limitations of sputtering and other deposition processes. Also, during the electroplating of copper, pinch off may occur, especially near the backside opening of high aspect ratio vias, that result in voids in the conductive filler material. Another problem is that because the seed layer is formed over the entire surface of the backside of the wafer, the via filler material is also formed on the entire surface of the wafer. Such material may have to be subsequently removed.

Another method for via formation through a substrate involves etching a via opening through an entire wafer. A seed layer is then sputtered on the backside of the wafer in such a manner as to be sufficiently thick to close the via off from the backside. A conductive filler material is then deposited from the front side of the wafer by electroplating. One problem with this method is that vias must be formed through the entire wafer. Also, the bottom seed layer would have to be removed or patterned after via filling. Removal or patterning of such a thick metal layer may be complex, difficult to control, and/or time consuming. Furthermore, the conductive filler material does not form a connection to a pre-existing electrical interconnect of the circuit. Thus additional processing must be performed to connect the filled via to circuit elements on the front side of the wafer. This additional processing would be performed on a thinned wafer where wafer thinning is done prior to through wafer via formation.

What is desired is an improved technique for forming a conductive via through a substrate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
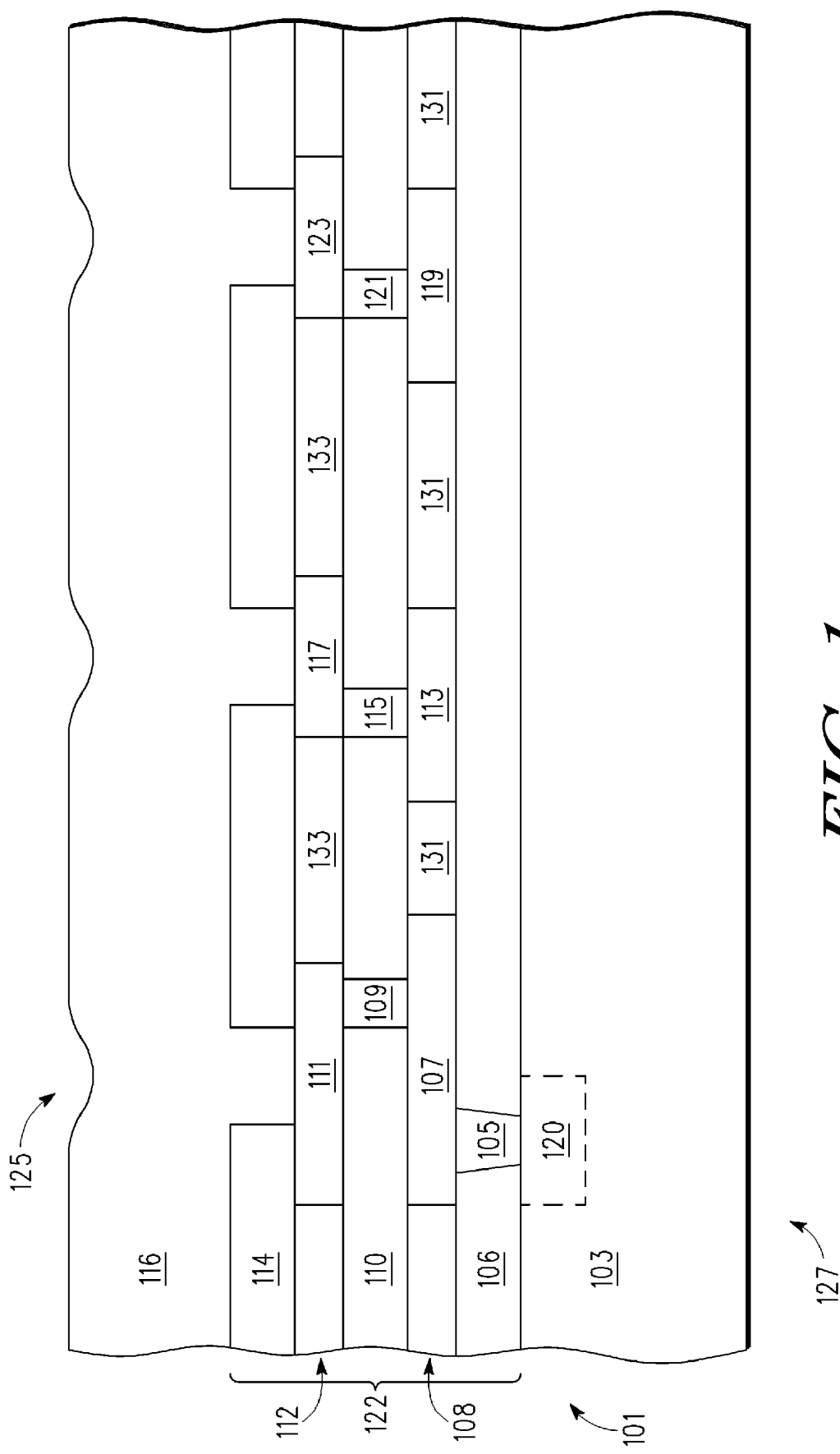
FIGS. 1-8 are partial cutaway side views of a wafer during various stages in its manufacture according to one embodiment of the present invention.

FIG. 1 is a partial cutaway side view of one embodiment of a wafer at one stage of its manufacture according to one embodiment of the present invention. In the embodiment shown, wafer 101 includes a semiconductor substrate 103 made of a bulk semiconductor material e.g. monocrystal silicon, gallium arsenide, or silicon germanium. A semiconductor substrate is a substrate that includes a semiconductor material. In other embodiments, a semiconductor substrate may have other configurations such as a semiconductor on insulator (SOI) configuration. Examples of SOI configurations include a silicon-on-insulator (e.g. silicon oxide) on a bulk semiconductor material substrate and a silicon-on-sapphire substrate. In other embodiments, a semiconductor substrate may include multiple layers of different semiconductor materials e.g. silicon germanium located over silicon, silicon located over silicon germanium (and located over silicon), and/or dielectric materials. Substrate 103 includes active circuitry (e.g. transistor 120) formed on the front side of substrate 103. The front side of a wafer or substrate is the side of a wafer or substrate where the active circuitry is formed. The backside of a wafer or substrate is the side of the wafer or substrate opposite from the front side.

After active circuitry formation on substrate 103, multilevel interconnect 122 is formed on the front side 125 of wafer 101. Multilevel interconnect 122 includes interlevel dielectric layers 106 and 110. Multilevel interconnect 122 also includes interconnect layers 108 and 112. Interlevel dielectric layers 106 and 110 include dielectric material e.g. TEOS, $SiO_2$, or low K dielectrics that electrically insulates metal interconnects of adjacent interconnect layers. Interlevel dielectric layers 106 and 110 may also include etch stop layers and barrier layers e.g. made of materials as silicon nitride or silicon carbon nitride. The etch stop layers and barrier layers are not shown in FIG. 1. Interlevel dielectric layers 106 and 110 also include conductive vias 105, 109, 115, and 121 having a conductive filler material of e.g. copper, tungsten, gold, and/or aluminum. The conductive vias interconnect active circuitry (e.g. 120) on the front side of substrate 103 with the metal interconnects 107, 111, 113, 117, 119, and 123 of interconnect layers 108 and 112. Each interconnect layer (108 and 112) also includes intralayer dielectric material (131 and 133) located between the metal interconnects (e.g. 107 and 113) of that interconnect layer. The dielectric material of the interconnect layers 106 and 110 may also include etch stop layers and barrier layers (not shown).

Metal interconnects 107, 111, 113, 117, 119, and 123 of interconnect layers 108 and 112 may be formed by forming a conductive layer over the front side 125 of wafer 101 and subsequently patterning the conductive layer. In one embodiment of patterning to form metal interconnects (referred to as an in-laid process), a layer of intra layer dielectric material (e.g. 131, 133) is formed over front side 125 of wafer 101 e.g. by chemical vapor deposition (CVD), and subsequently patterned to form trenches therein. A metal layer e.g. copper, is then formed over front side 125 of wafer 101 including in the trenches. Front side 125 is then planarized (e.g. by a chemical mechanical polishing (CMP)) wherein only the copper material remains in the trenches of the intra layer dielectric material.

In another embodiment of patterning a metal layer to form metal interconnects 107, 111, 113, 117, 119, and 123, a layer of metal (e.g. aluminum) is deposited on front side 125 of wafer 101. The metal layer is then patterned using photolithographic and etch processes to form the metal interconnects. Interlayer dielectric material is then deposited over front side 125 wherein the intralayer dielectric material is then planarized using CMP or other planarization techniques such as resist coat and etch back.

In some embodiments, metal interconnects (107, 111, 113, 117, 119, and 123) may also include multiple layers of different materials. For example, a metal interconnect may also include a conductive barrier layer (e.g. tantalum, tantalum nitride, titanium nitride, or titanium tungsten).

Multilevel interconnect 122 also includes a top dielectric layer 114. In one embodiment, layer 114 includes a dielectric material e.g. silicon oxide, silicon oxynitride, silicon nitride, or polyimide. In some embodiments, dielectric layer 114 includes multiple dielectric layers and may include etch stop layers and barrier layers. Dielectric layer 114 includes openings to expose interconnects 111, 117 and 123 of interconnect layer 112.

In the embodiment shown, a metal layer 116 is formed over front side 125 of wafer 101. In one embodiment, layer 116 includes aluminum but may include other conductive material such as copper, gold, or tungsten. In addition, layer 116 may include barrier or seed layers (e.g. titanium nitride, titanium tungsten, or tantalum).

Layer 116 may be formed by sputtering, CVD, plating, physical vapor deposition (PVD) or other processes. Layer 116 is a continuous conductive layer formed over all of front side 125 of wafer 101. In one embodiment, layer 116 has a thickness in the range of 10,000 Angstroms to 50,000 Angstroms but may have other thicknesses in other embodiments.

Figure 2:
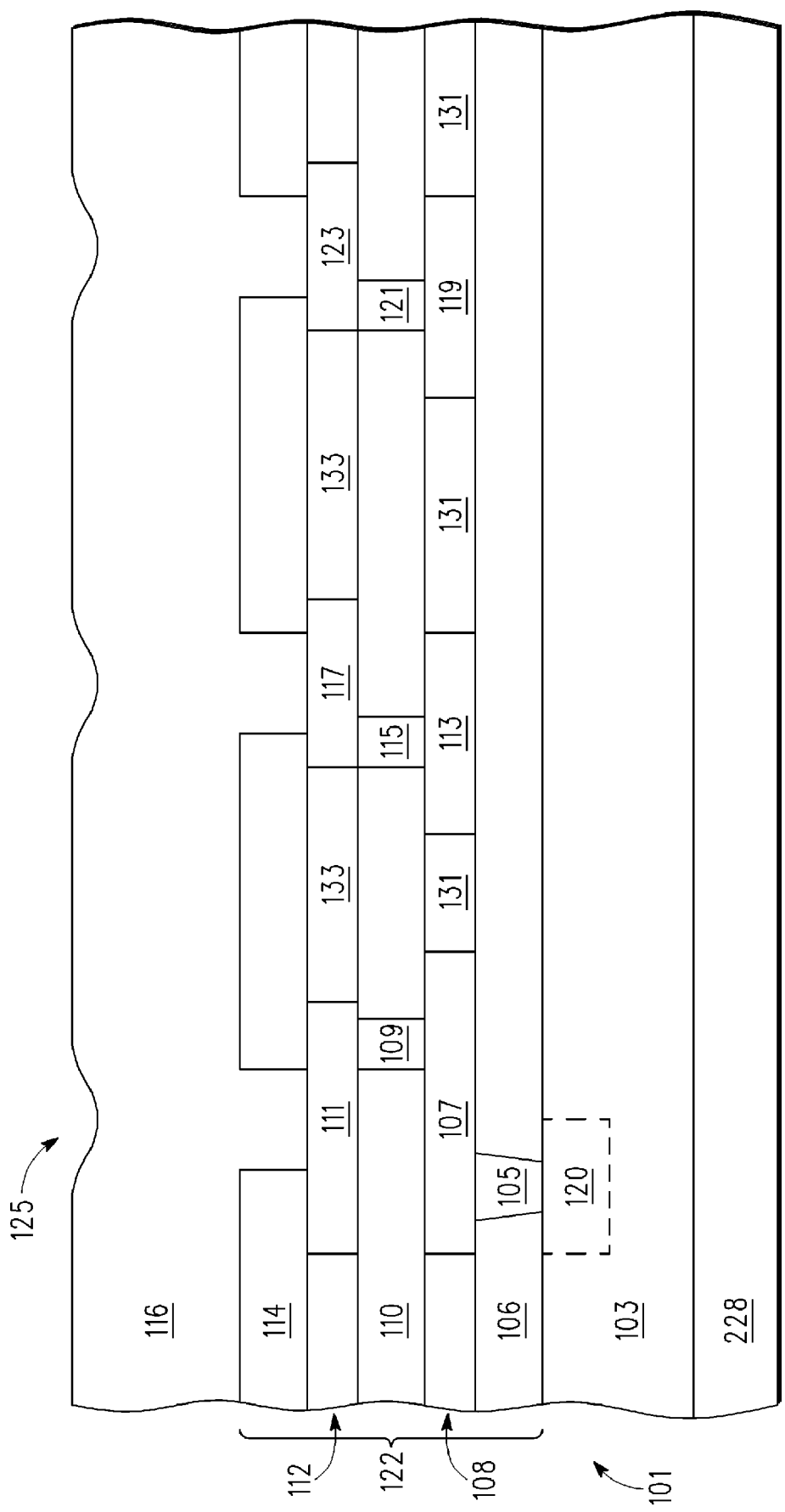

FIG. 2 is a partial cutaway side view of wafer 101 after substrate 103 has been thinned to reduce its thickness. Substrate 103 may be thinned by grinding, etching, CMP, or by combinations of such processes. In one embodiment, substrate 103 has thickness in the range 300 microns to 1000 microns before thinning and a thickness in the range of 10 to 200 microns after thinning. However, wafers of other embodiments may have other thicknesses both before and after thinning.

After thinning, a dielectric layer 228 is formed on backside 127 of wafer 101. Dielectric layer may include silicon oxide, silicon nitride, TEOS, a diamond-like material, and/or sapphire. In one embodiment, layer 228 may be deposited (e.g. CVD, PVD) or grown from a substrate including semiconductor material on backside 127. In some embodiments, layer 228 is not utilized.

Figure 3:
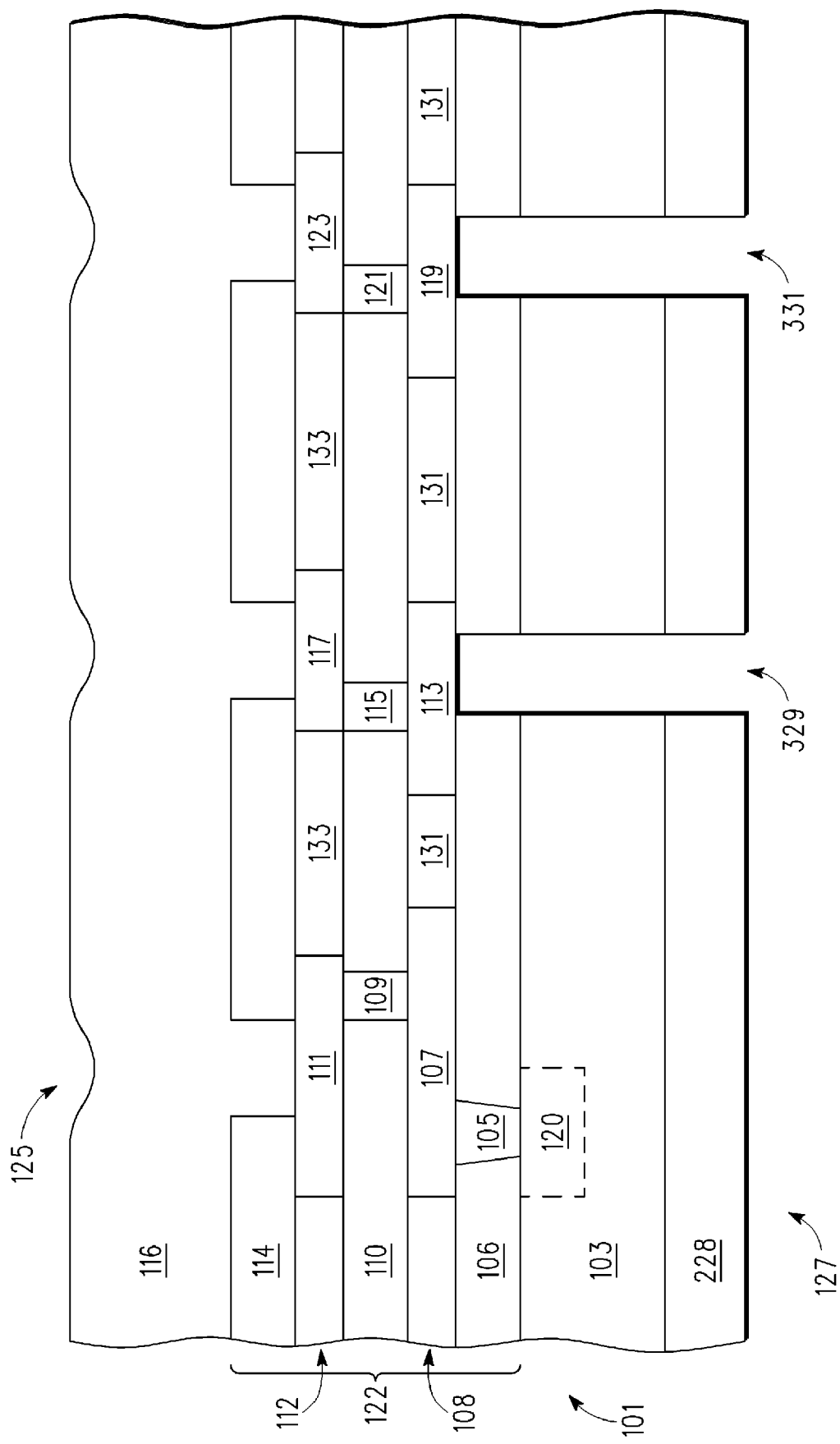

FIG. 3 shows a partial cutaway side view of wafer 101 after openings or holes for vias 329 and 331 are formed from backside 127 of wafer 101 to interconnects 113 and 119, respectively. In one embodiment, the holes for vias 329 and 331 are formed by forming a layer of photo resist over backside 127 and patterning the photo resist to form an etch mask for vias 329 and 331. In forming the holes for vias 329 and 331, the material of dielectric layer 228, substrate 103, and the interlayer dielectric material of layer 106 are etched using etch chemistries that are appropriate for removing the materials of those layers. In one embodiment, after layer 228 is etched, the layer of patterned photo resist (not shown) is removed wherein layer 228 is used as a hard mask for subsequent etching of substrate 103 and layer 106. In one embodiment, the aspect ratio of the depth to width of the hole for vias 329 and 331 is in the range of 0.5:1 to 10:1 but other aspect ratios may be utilized in other embodiments.

Figure 4:
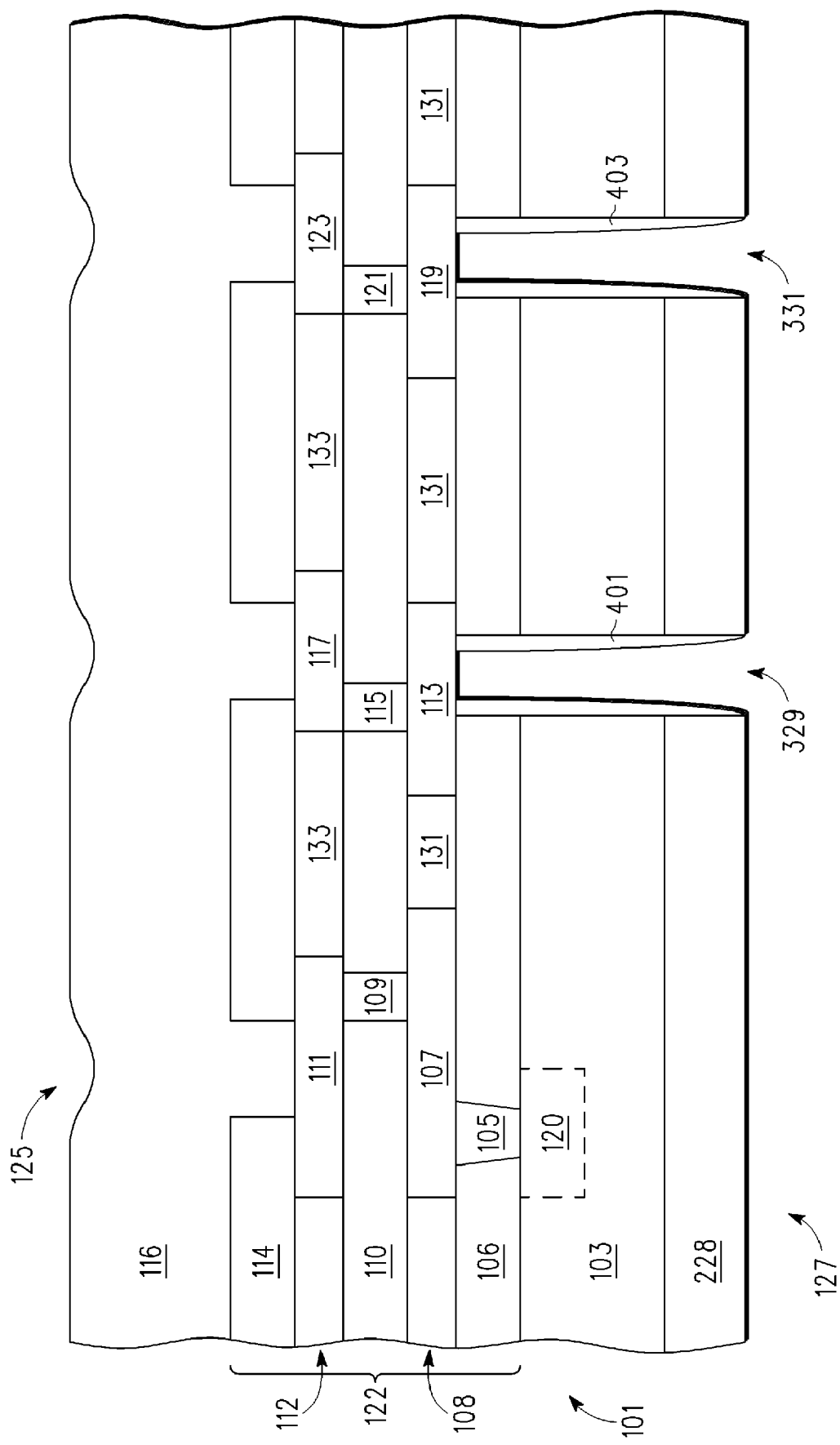

As shown in FIG. 4, after the formation of the holes for vias 329 and 331, side wall liners 401 and 403 are formed on the sidewalls of vias 329 and 331, respectively. In one embodiment, liners 401 and 403 are formed by depositing a conformal layer of spacer material (e.g. by CVD or atomic layer deposition (ALD)) and then anisotropically etching that conformal layer to leave liners 401 and 403 while exposing portions of interconnect 113 and 119, respectively. In one embodiment, liners 401 and 403 are of a dielectric material (e.g. silicon oxide, silicon nitride, silicon oxynitride) for electrically isolating subsequently formed conductive filler material from substrate 103. In other embodiments, liners 401 and 403 are of a material to act as a diffusion barrier for inhibiting diffusion of the metal filler material into substrate 103.

In some embodiments, liners 401 and 403 may be of a conductive material to electrically couple the filler material to the substrate. Such a configuration may be desirable for grounding substrate 103. Other embodiments may not include liners 401 and 403.

Figure 5:
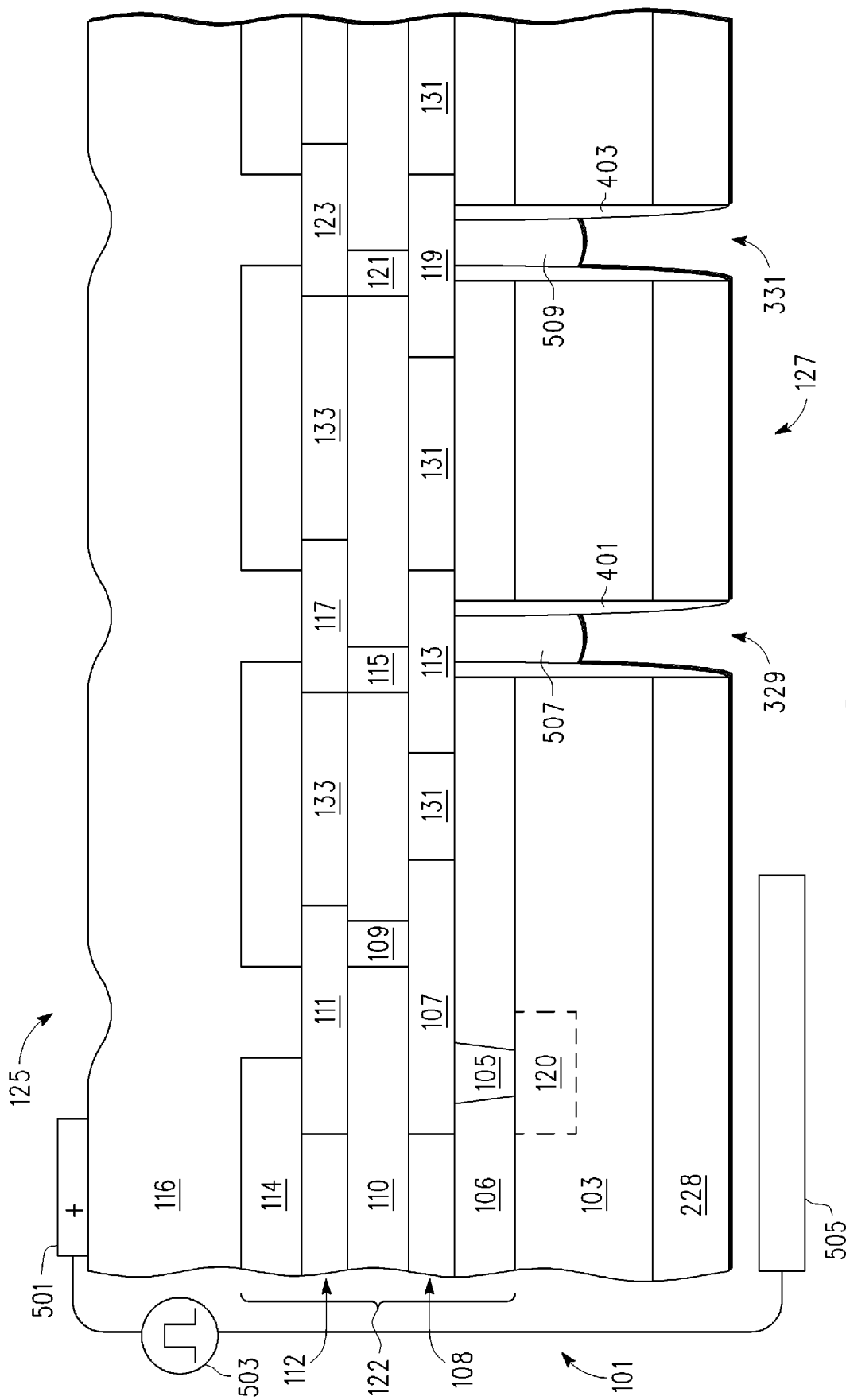

FIG. 5 shows a partial cutaway side view of wafer 101 during an electroplating process for the deposition of conductive filler material 507 and 509 in vias 329 and 331, respectively. In the embodiment shown, metal interconnects 113 and 119 act as landing pads and seed layers for the electroplating of the conductive filler material 507 and 509. In the embodiment shown, a cathode connector 501 is electrically connected to conductive metal layer 116, which is electrically coupled to interconnect 113 though conductive via 115 and interconnect 117 and is electrically coupled to interconnect 119 through conductive via 121 and interconnect 123.

Cathode connector 501 is electrically coupled to an electroplating power source 503, which in the embodiment shown is a pulsed DC power source. An anode 505 is electrically coupled to source 503. In one embodiment, wafer 101 and anode 505 are submersed in an electrolyte plating solution and current from power source 503 sources current to connector 501, where material from anode 505 is deposited in vias 329 and 331. During electroplating, the filler material initially builds from interconnects 113 and 119 and continues to electroplate on the previously electroplated filler material. Because interconnects 113 and 119 are electrically coupled to layer 116, layer 116 acts as a current source during the electroplating for the formation of filler material 507 and 509 respectively. In the embodiment of FIG. 5, vias 329 and 331 are shown as partially filled with conductive filler material 507 and 509, respectively. Other electroplating processes may be utilized in other embodiments.

Layer 116 may be protected or sealed during the electroplating process to avoid the deposition of material from anode 505 on that layer.

In one embodiment, the filler material includes copper but may include other material such as e.g. gold, nickel, palladium, alloys thereof or other platable conductive material.

In one embodiment, cathode connector 501 is connected to layer 116 at a perimeter region of wafer 101. In some embodiments, the perimeter region would be a region of a wafer that would not be part of an integrated circuit upon singulation of the wafer into multiple integrated circuits. In other embodiments, the region where cathode connector 501 attaches is on an area of layer 116 which is not subsequently used to form external connectors (e.g. bond pads) or other types of connectors of an integrated circuit.

If layer 116 is sealed during the electroplating process, interconnects 113 and 119 are the only exposed conductive structures shown in FIG. 5 electrically coupled to cathode connector 510. Accordingly, filler material is only formed initially in vias 319 and 331 during the electroplating process. Accordingly, other structures are not plated with the conductive filler material. Accordingly, with this embodiment, the removal of a continuous layer of filler material on backside 127 after the electroplating process may not be required.

Figure 6:
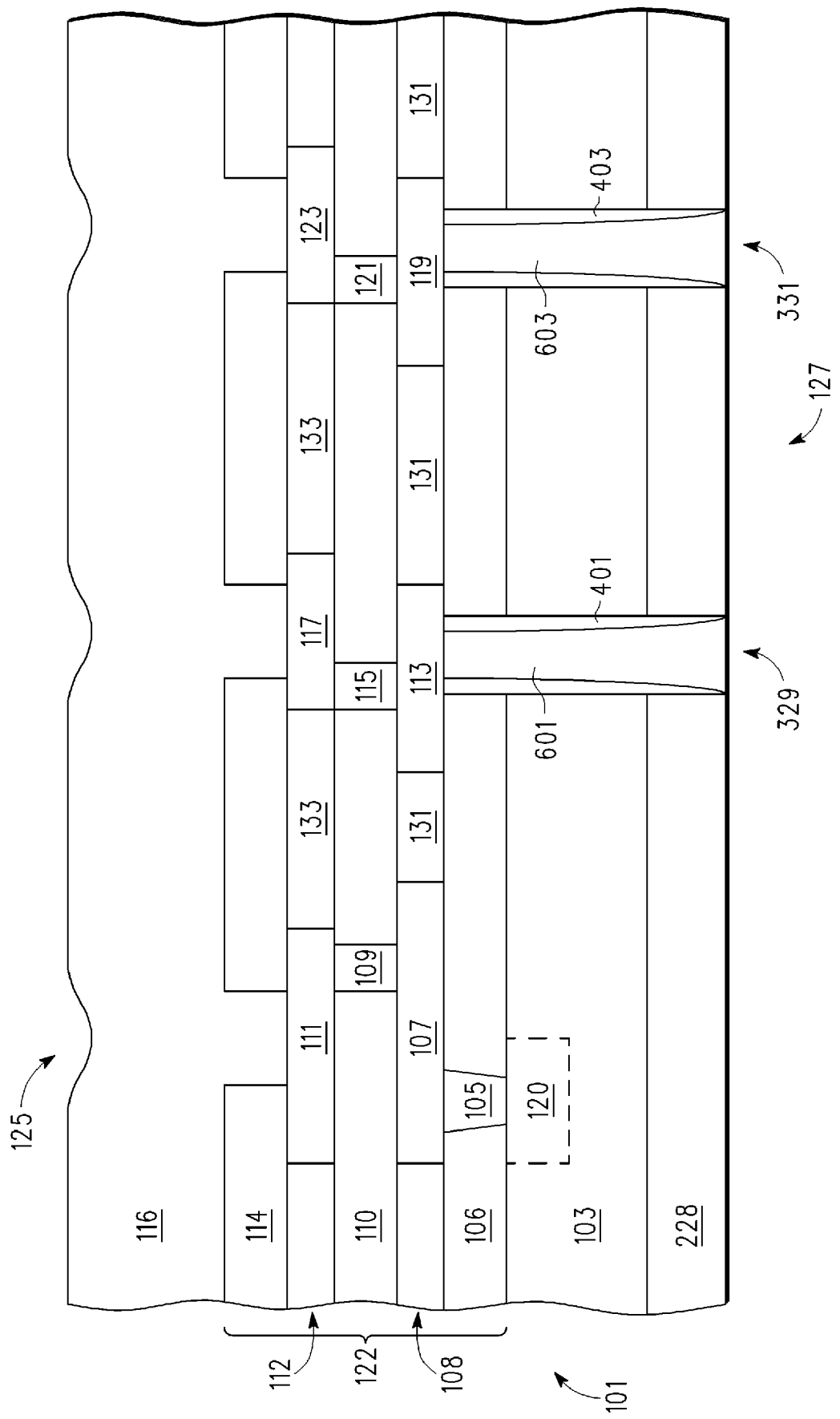

FIG. 6 shows wafer 101 after vias 329 and 331 have been completely filled with conductive filler material 601 and 603, respectively. In one embodiment, the electroplating is performed to a point where the filler material overfills or begins to extend over some portion of dielectric layer 228. In some embodiments, backside 127 would be planarized after electroplating to make filler material 601 and 603 co-planar with layer 228.

Figure 7:
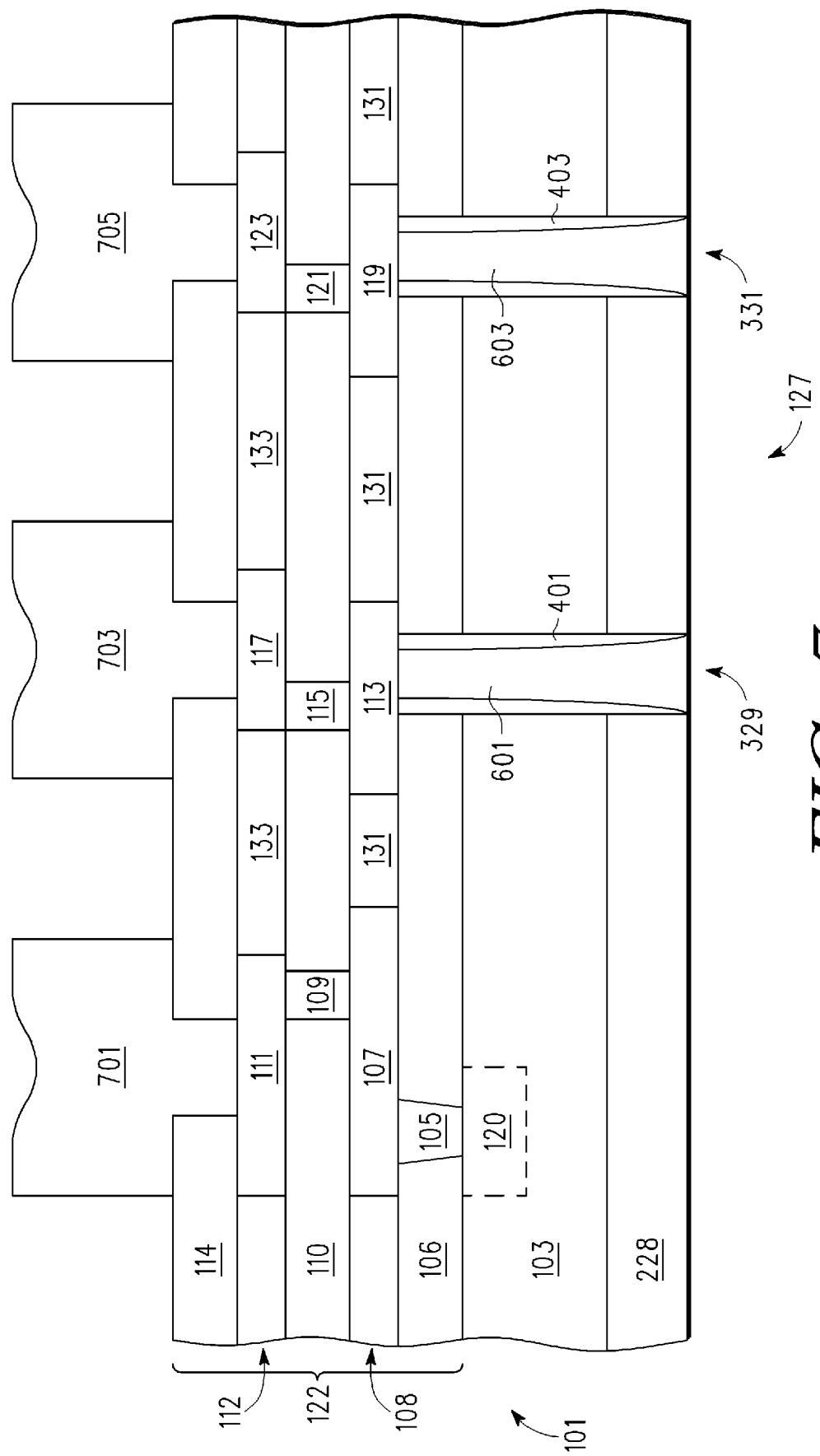

FIG. 7 shows wafer 101 after layer 116 has been patterned to form conductive pads. In one embodiment, layer 116 is patterned by photolithographic and techniques. For example, a layer of photo resist may be deposited on front side 125 over layer 116 and patterned to form mask structures. All material of layer 116 not located under the mask structures would be removed to leave the pads.

In one embodiment, pads 701, 703, and 705 are external wire bond pads. In another embodiment, pads 701, 703, and 705 are each under bump pad structures for a bump connector, where subsequent metal is formed on pads 701, 703, and 705 to complete the bump structure. These external conductors are used to electrically couple the circuitry of the integrated circuits of wafer 101 to external circuitry. In other embodiments, another integrated circuit may be electrically coupled to pads 701, 703, and 705, such as in a multiple die package configuration (e.g. as in vertical or 3-D integration).

One advantage that may occur from utilizing a metal layer, that is used to form the external connectors, for cathode connector attachment is that additional interlevel metal layer deposition is not require after the thinning of the wafer for backside via formation. With some prior art methods where a via is formed through the entire wafer, subsequent metal layer deposition is needed to interconnect the circuitry of the wafer. Such deposition is made more complex by the reduction of substrate thickness. For some of the embodiments described herein, all front side interlevel metal layers are deposited prior to wafer thinning.

However, additional interconnect levels may be added on top of pads 701, 703 and 705 to further interconnect the active circuitry of the substrate 103 with structures for external electrical connection. For example, another metal layer may be deposited and patterned on front side 125 for the interconnection of pads 701, 703, and 705. In some embodiments, an interconnect utilized as a seed layer (e.g. interconnect 119) for the formation of a conductive via may not be electrically coupled to an external electrical connector.

Figure 8:
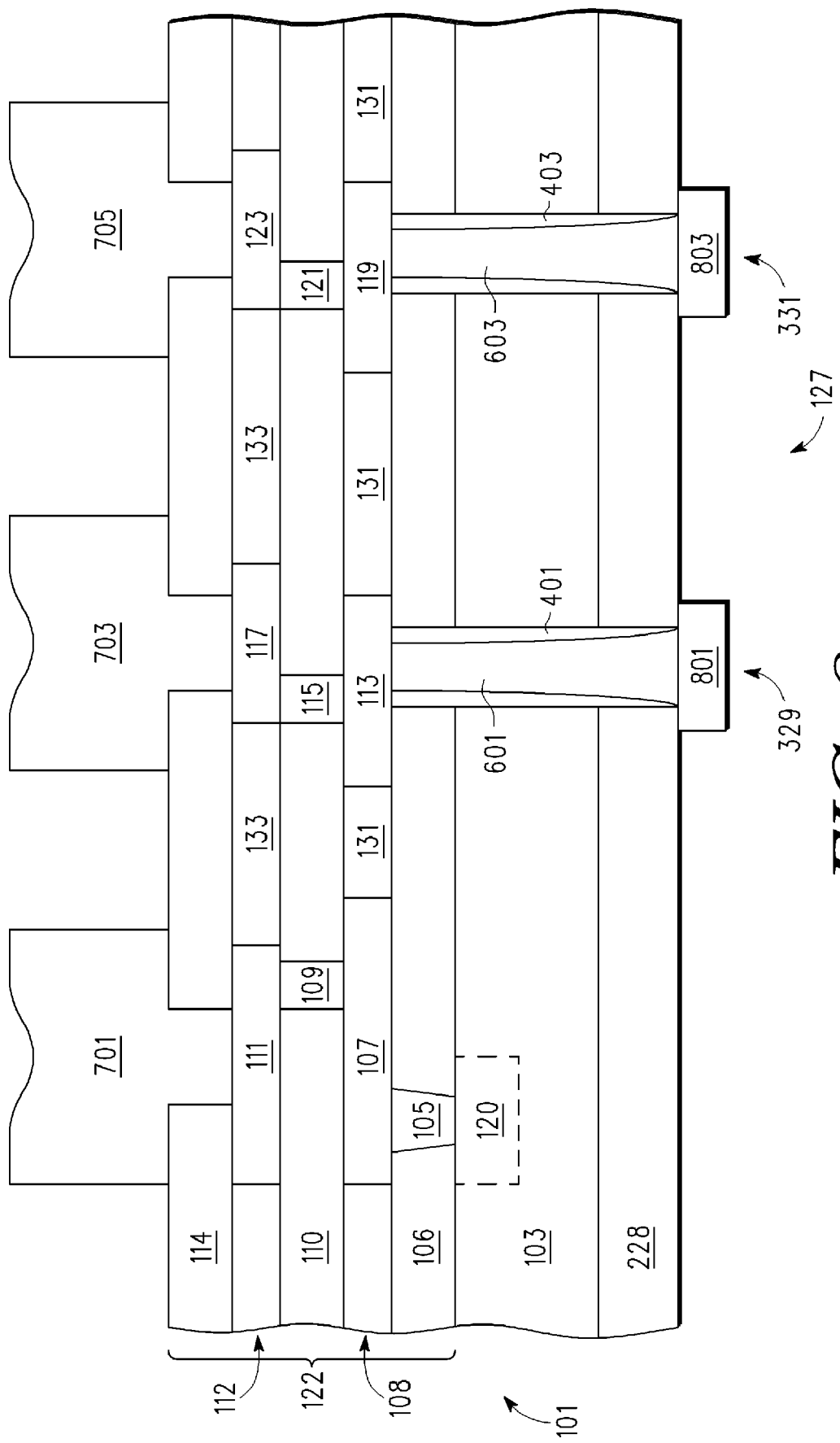

FIG. 8 shows a partial cutaway side view of wafer 101 after backside connector pads 801 and 803 are formed. Pads 801 and 803 are electrically coupled to filler material 601 and 603, respectively. In the embodiment shown, pad 801 is electrically coupled to pad 703 and pad 803 is electrically coupled to pad 705.

In one embodiment, connector pads 801 and 803 are formed by the deposition of a metal layer and photolithographic and etch patterning of the metal layer. In other embodiments, pads 801 and 803 are formed by an in-laid process where a dielectric layer is deposited and openings for the pads are formed. A metal layer is then deposited over backside 127 including in the openings and then is planarized where the metal located outside the openings is removed.

In another embodiment, pads 801 and 803 may be formed by depositing a seed conductive layer over backside 127, forming a layer of photo resist over the seed layer with openings for the pads, and then electroplating material in the openings. In subsequent processes, the photo resist and seed layer external to the pads would be removed. In still another embodiment, pads 801 and 803 would be formed by selective deposition of metal on the conductive filler material 601 and 603.

In other embodiments, pads 801 and 803 may be formed prior to the patterning of layer 116. Other embodiments do not include pads 801 and 803. Still in other embodiments, at least a portion of layer 228 may be removed after the formation of filler material 601 and 603 such that a portion of filler material 601 and 603 extends out from backside 127.

In one embodiment, pads 801 and 803 are utilized for external connection of the circuitry of the integrated circuits of wafer 101 to external circuitry.

Figure 9:
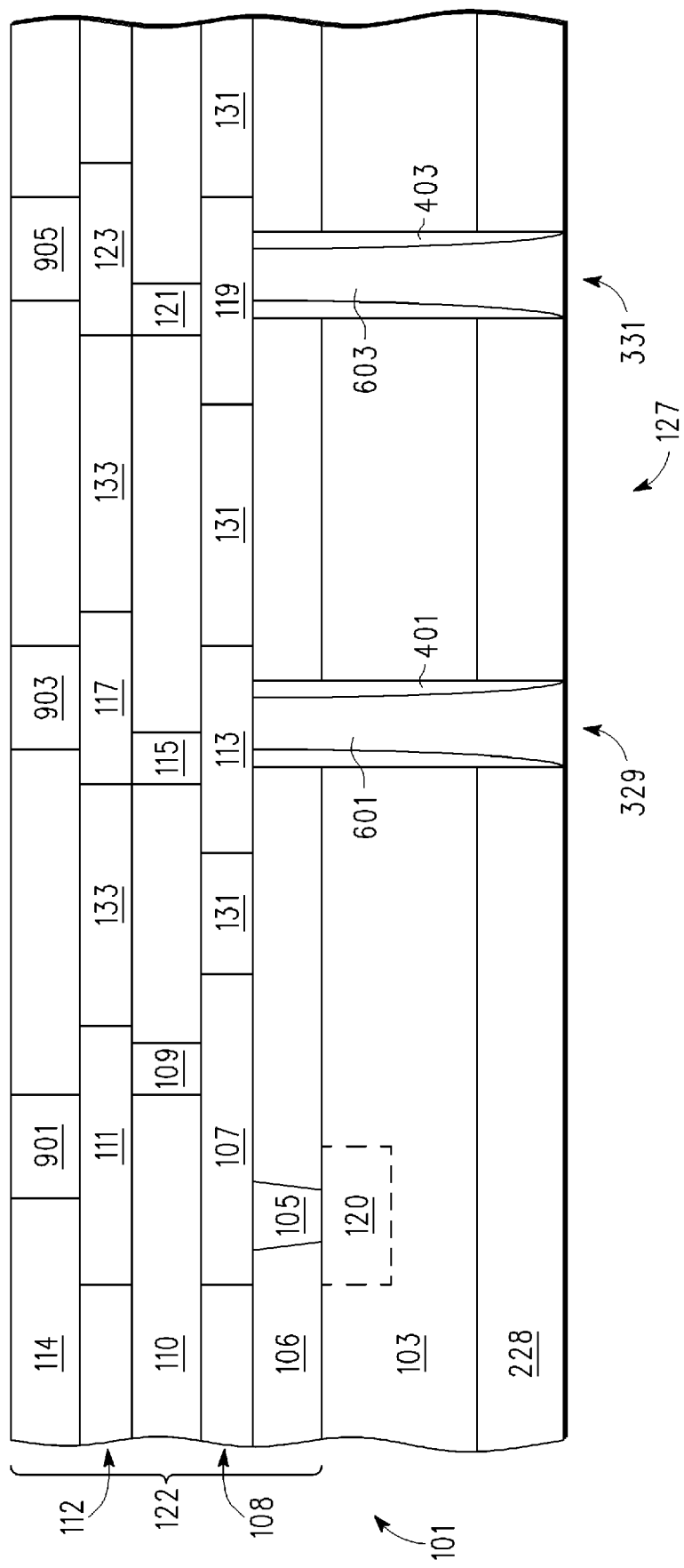
FIG. 9 is a partial cutaway side view of a wafer during a stage in its manufacture according to another embodiment of the present invention.

FIG. 9 shows a second embodiment of wafer 101. The embodiment of FIG. 9 is different from the embodiment of FIG. 7 in that pads 901, 903, and 905 are patterned from metal layer 116 by an in-laid process as opposed to a patterning process for forming pads 701, 703, and 705 of FIG. 7. In one in-laid patterning process, layer 116 is planarized (e.g. by a CMP process) such that the material of layer 116 external to the openings in layer 114 is removed. In subsequent processes, additional structures (e.g. pads 801 and 803) may be formed on wafer 101.

Wafer 101 includes other active circuitry, interconnects, and through substrate conductive vias (not shown) located at other regions of wafer 101. Wafer 101 may be subsequently singulated into multiple integrated circuits. The integrated circuits may then be packaged into integrated circuit packages wherein the pads (e.g. 701, 801, and 901) are electrically coupled to conductive structures of the package. In one embodiment, the integrated circuits maybe part of multi integrated circuit packages.

In the embodiment shown, the seed layers for electroplating (interconnects 119 and 113) are located in the first formed interconnect layer 108 of multilevel interconnect 122. However, in other embodiments, the seed layers may be located in other metal layers (e.g. 112) formed subsequently to layer 108.

One advantage that may occur from utilizing an interior conductive interconnect (e.g. 113 and 119) as a landing pad and seed layer for conductive via formation is that it reduces the amount of the thickness of wafer 101 that has to be removed in the formation of vias 329 and 331 as compared to a via that is formed all the way through a wafer 101. A reduction in the amount of wafer removed for a through substrate via not only reduces etching time, it also reduces the number of etching steps in that the number of layers of different material is reduced. For example, because not all of the layers of multilayer interconnect 122 are removed, less etching processes are needed to make vias 329 and 331.

Also, the utilization of layer that will be used to form subsequent conductive structures of an integrated circuit (e.g. 116) as a cathode connector contact layer and current source further reduces the number of processing steps needed for electroplating to form a backside via connection. Because layer 116 will be subsequently used to form electrical connectors for the integrated circuits of wafer 101, the electroplating will not require an addition step of seed layer formation and removal as with other electroplating via formation methods.

Furthermore, using a front side metal layer as a cathode connector contact layer allows for build up of the conductive via filler material from the backside of a wafer without having to deposit a seed layer into the via hole from the backside. Accordingly, voids and bread loafing of the seed layer material into the via can be avoided. Thus, vias with a higher aspect ratio may be formed using processes described herein. Further without having to form a seed layer on the backside of the wafer, planarization processes may be efficiently utilized in removing the over plated filler material in that a seed layer does not also have to be removed in the planarization process.

Furthermore, the use of electroplating for conductive via filler material deposition allows the via to be filled from an internal conductor to the backside thereby reducing void and bread loafing that may occur from conformal layer filler material deposition. Accordingly, higher aspect ratio via formation may be utilized. In addition, by utilizing an electroplating process instead of a conformal process for depositing conductive filler material, material formation occurs mainly in the via hole and not outside of the via hole. This may advantageously reduce the amount of excess filler material that is to be removed after the via has been filled with conductive material.

In addition, because the exposed portion of the seed layers (e.g. patterned interconnects 119 and 113) are in the via openings, the material build up rate during electroplating is enhanced as compared to processes that electroplate over a seed layer covering an entire wafer. Because the seed layer is only located in areas of material formation, the amount of area to electroplate is reduced and that area is electroplated at a faster rate. Thus, having patterned structures as seed layers reduces plating time.

Although the methods set forth above described electroplating from the backside of a wafer, the method described herein may also be utilized to electroplate from a front side of a wafer as well.

One embodiment includes a method for forming a conductive via. The method includes forming a conductive layer over a first side of a semiconductor substrate. The semiconductor substrate comprises a first side and a second side and the first side is opposite the second side. The method also includes patterning the conductive layer to form a landing pad and forming a via hole in the semiconductor substrate from the second side of the semiconductor substrate. The via hole exposes the landing pad. The method also includes electroplating a conductive via material in the via hole using the landing pad as a seed layer.

Another embodiment includes a method for forming a conductive via. The method includes forming a seed layer over a first side of a semiconductor substrate. The semiconductor substrate comprises a first side and a second side and the first side is opposite the second side. The method also includes forming a continuous conductive layer over the seed layer. The seed layer is electrically coupled to the continuous conductive layer. The method further includes after forming the seed layer, forming a via hole in the semiconductor substrate from the second side of the semiconductor substrate. The via hole exposes the seed layer. The method also includes electroplating a conductive via material from the seed layer in the via hole using the continuous conductive layer as a current source.

Another embodiment includes a method for forming a conductive via. The method includes forming a conductive layer over a first side of a semiconductor substrate. The semiconductor substrate comprises a first side and a second side. The first side is opposite the second side. The semiconductor substrate comprises active circuitry. The method also includes patterning the conductive layer to form a landing pad and forming a continuous conductive layer over the landing pad. The continuous conductive layer is electrically coupled to the landing pad. The method also includes etching the semiconductor substrate from the second side to form a via hole and expose the landing pad and electroplating a conductive via material in the via hole using the landing pad as a seed layer and the continuous conductive layer as a current source. The method also includes patterning the continuous conductive layer after electroplating the conductive via material.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a conductive via, the method comprising:
   forming a conductive layer over a first side of a semiconductor substrate, wherein the semiconductor substrate comprises a first side and a second side and the first side is opposite the second side;
   patterning the conductive layer to form a landing pad;
   forming a via hole in the semiconductor substrate from the second side of the semiconductor substrate, wherein the via hole exposes the landing pad; and
   electroplating a conductive via material in the via hole using the landing pad as a seed layer;
   forming a continuous conductive layer over the first side of the semiconductor substrate, wherein the landing pad is electrically coupled to the continuous conductive layer, and the continuous conductive layer serves as a current source for electroplating the conductive via material.

2. The method of claim 1, wherein the via hole comprises a sidewall and the method further comprises forming a sidewall liner along the sidewall of the via hole.

3. The method of claim 2, wherein the sidewall liner is a diffusion barrier layer.

4. The method of claim 2, wherein the sidewall liner is an insulator.

5. The method of claim 1, wherein:
   forming the conductive layer further comprises forming the conductive layer, wherein the conductive layer comprises copper; and
   forming the continuous conductive layer further comprises forming the continuous conductive layer, wherein the continuous conductive layer comprises aluminum.

6. The method of claim 1, wherein the method further comprises:
   patterning the continuous conductive layer after electroplating the conductive via material.

7. The method of claim 6, wherein patterning the continuous conductive layer comprises chemical mechanically polishing the continuous conductive layer.

8. The method of claim 6, wherein patterning the continuous conductive layer comprises etching the continuous conductive layer.

9. The method of claim 1, further comprising:
   forming a conductive feature over the second side of the semiconductor substrate, wherein the conductive feature is electrically coupled to the conductive via material.

10. The method of claim 1, further comprising:
forming a dielectric layer over the second side of the semiconductor substrate before forming the via hole.

11. The method of claim 1, further comprising:
forming active circuitry on the semiconductor substrate.

12. The method of claim 1 wherein the landing pad is a metal interconnect of a multilevel interconnect formed over the first side of the semiconductor substrate.

13. A method for forming a conductive via, the method comprising:
forming a seed layer over a first side of a semiconductor substrate, wherein the semiconductor substrate comprises a first side and a second side and the first side is opposite the second side;
forming a continuous conductive layer over the seed layer, wherein the seed layer is electrically coupled to the continuous conductive layer;
after forming the seed layer, forming a via hole in the semiconductor substrate from the second side of the semiconductor substrate, wherein the via hole exposes the seed layer; and
electroplating a conductive via material from the seed layer in the via hole using the continuous conductive layer as a current sources patterning the continuous conductive layer after electroplating the conductive via material.

14. The method of claim 13, wherein the via hole comprises a sidewall and the method further comprises forming a liner along the sidewall of the via hole.

15. The method of claim 13, further comprising:
forming a conductive feature over the second side of the semiconductor substrate, wherein the conductive feature is electrically coupled to the conductive via material.

16. The method of claim 13, further comprising:
forming active circuitry on the semiconductor substrate.

17. The method of claim 13 wherein the forming the seed layer includes:
forming a second continuous conductive layer over the first side of the semiconductor substrate, wherein the second continuous conductive layer is formed prior to the formation of the continuous conductive layer;
patterning the second continuous conductive layer to form the seed layer.

18. A method for forming a conductive via, the method comprising:
forming a seed layer over a first side of a semiconductor substrate, wherein the semiconductor substrate comprises a first side and a second side and the first side is opposite the second side;
forming a continuous conductive layer over the seed layer, wherein the seed layer is electrically coupled to the continuous conductive layer;
after forming the seed layer, forming a via hole in the semiconductor substrate from the second side of the semiconductor substrate, wherein the via hole exposes the seed layer; and
electroplating a conductive via material from the seed layer in the via hole using the continuous conductive layer as a current source;
wherein the forming the continuous conductive layer further comprises forming the continuous conductive layer, wherein the continuous conductive layer comprises aluminum.

19. The method of claim 18, wherein the method further comprises:
patterning the continuous conductive layer after electroplating the conductive via material.

20. The method of claim 18, wherein:
forming the seed layer further comprises forming the seed layer, wherein the seed layer comprises copper.

21. A method for forming a conductive via, the method comprising:
forming a conductive layer over a first side of a semiconductor substrate, wherein the semiconductor substrate comprises a first side and a second side, the first side is opposite the second side, and the semiconductor substrate comprises active circuitry;
patterning the conductive layer to form a landing pad;
forming a continuous conductive layer over the landing pad, wherein the continuous conductive layer is electrically coupled to the landing pad;
etching the semiconductor substrate from the second side to form a via hole and expose the landing pad;
electroplating a conductive via material in the via hole using the landing pad as a seed layer and the continuous conductive layer as a current source; and
patterning the continuous conductive layer after electroplating the conductive via material.

22. The method of claim 21 wherein the semiconductor substrate is part of a wafer, the method further comprises:
singulating the wafer into a plurality of integrated circuits after the patterning the continuous conductive layer, wherein no other continuous conductive layer is formed over the first side of the semiconductor substrate after the patterning the continuous conductive wafer and before the singulating.

* * * * *